(12) United States Patent
Capote et al.

(10) Patent No.: US 6,566,234 B1
(45) Date of Patent: May 20, 2003

(54) SEMICONDUCTOR FLIP-CHIP PACKAGE AND METHOD FOR THE FABRICATION THEREOF

(75) Inventors: Miguel A. Capote, Carlsbad, CA (US); Zhiming Zhou, Woodbury, MN (US); Xiaoqi Zhu, Vista, CA (US); Ligui Zhou, Pleasanton, CA (US)

(73) Assignee: Aguila Technologies, Inc., San Marcos, CA (US)

( * ) Notice: Subject to any disclaimer, the term of this patent is extended or adjusted under 35 U.S.C. 154(b) by 0 days.

(21) Appl. No.: 09/662,642

(22) Filed: Sep. 15, 2000

Related U.S. Application Data

(62) Division of application No. 09/120,172, filed on Jul. 21, 1998, now Pat. No. 6,121,689.
(60) Provisional application No. 60/056,043, filed on Sep. 2, 1997, and provisional application No. 60/053,407, filed on Jul. 21, 1997.

(51) Int. Cl.7 ............................ H01L 21/30; H01L 21/46
(52) U.S. Cl. .................. 438/458; 438/464; 438/460
(58) Field of Search ...................... 438/458, 464, 438/460

(56) References Cited

U.S. PATENT DOCUMENTS

| | | | |
|---|---|---|---|
| 4,701,482 A | * 10/1987 | Itoh et al. ................. 523/435 |
| 4,745,215 A | * 5/1988 | Cox et al. ................. 560/301 |
| 4,999,699 A | * 3/1991 | Christie et al. .............. 357/65 |
| 5,001,542 A | 3/1991 | Tsukagoshi et al. |
| 5,060,844 A | * 10/1991 | Behun ..................... 228/180.2 |
| 5,128,746 A | * 7/1992 | Pennisi et al. ................ 357/72 |
| 5,203,075 A | * 4/1993 | Angulas et al. .............. 29/830 |
| 5,296,063 A | * 3/1994 | Yamamura et al. ........... 156/64 |
| 5,363,277 A | 11/1994 | Tanaka |
| 5,386,624 A | * 2/1995 | George et al. ............... 29/832 |
| 5,442,240 A | 8/1995 | Mukerji |
| 5,488,200 A | * 1/1996 | Tsukada .................... 174/261 |
| 5,524,422 A | * 6/1996 | Nguyen ..................... 53/477 |
| 5,579,573 A | * 12/1996 | Baker et al. ................. 29/840 |
| 5,710,071 A | 1/1998 | Beddingfield et al. |
| 5,742,100 A | 4/1998 | Schroeder et al. |
| 5,751,060 A | 5/1998 | Laine et al. |
| 5,751,068 A | 5/1998 | McMachon et al. |

(List continued on next page.)

FOREIGN PATENT DOCUMENTS

| | | | |
|---|---|---|---|
| EP | 0368262 | 11/1989 | |
| JP | 2-180036 | 7/1990 | |
| JP | 4060334035 A | * 12/1994 | ........ 438/FOR 386 |
| JP | 409232372 A | * 9/1997 | |

*Primary Examiner*—Eddie Lee
*Assistant Examiner*—Paul E Brock, II
(74) *Attorney, Agent, or Firm*—Nath & Associates PLLC; Gary M. Nath; Marvin C. Berkowitz

(57) ABSTRACT

A simplified process for flip-chip attachment of a chip to a substrate is provided by pre-coating the chip with an encapsulant underfill material having separate discrete solder columns therein to eliminate the conventional capillary flow underfill process. Such a structure permits incorporation of remeltable layers for rework, test, or repair. It also allows incorporation of electrical redistribution layers. In one aspect, the chip and pre-coated encapsulant are placed at an angle to the substrate and brought into contact with the pre-coated substrate, then the chip and pre-coated encapsulant are pivoted about the first point of contact, expelling any gas therebetween until the solder bumps on the chip are fully in contact with the substrate. There is also provided a flip-chip configuration having a complaint solder/flexible encapsulant understructure that deforms generally laterally with the substrate as the substrate undergoes expansion or contraction. With this configuration, the complaint solder/flexible encapsulant understructure absorbs the strain caused by the difference in the thermal coefficients of expansion between the chip and the substrate without bending the chip and substrate.

58 Claims, 8 Drawing Sheets

U.S. PATENT DOCUMENTS

| | | |
|---|---|---|
| 5,770,476 A | 6/1998 | Stone |
| 5,801,072 A | 9/1998 | Barber |
| 5,801,449 A | 9/1998 | Dehaine et al. |
| 5,861,661 A * | 1/1999 | Tang et al. .................. 257/668 |
| 5,880,530 A | 3/1999 | Mashimoto et al. |
| 5,896,276 A * | 4/1999 | Tamura et al. ............... 361/767 |
| 5,975,408 A * | 11/1999 | Goosen .................... 228/173.2 |
| 6,194,788 B1 | 2/2001 | Gilleo et al. |
| 6,228,678 B1 | 5/2001 | Gilleo et al. |
| 6,265,776 B1 | 7/2001 | Gilleo |
| 6,323,062 B1 | 11/2001 | Gilleo et al. |

* cited by examiner

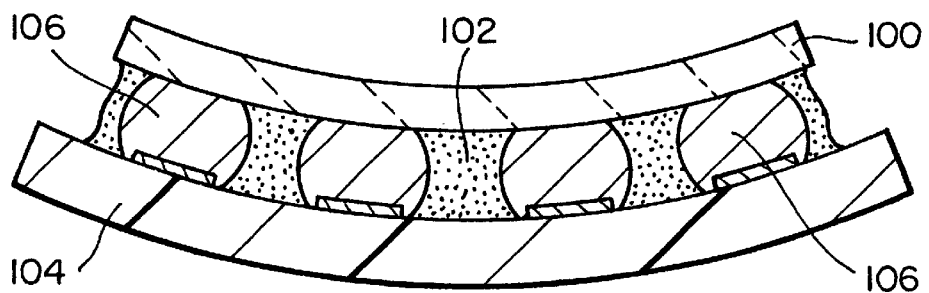
FIG_1
(PRIOR ART)
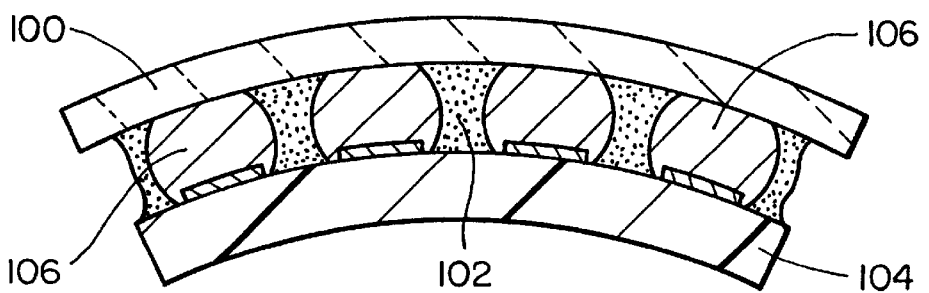
FIG_2
(PRIOR ART)
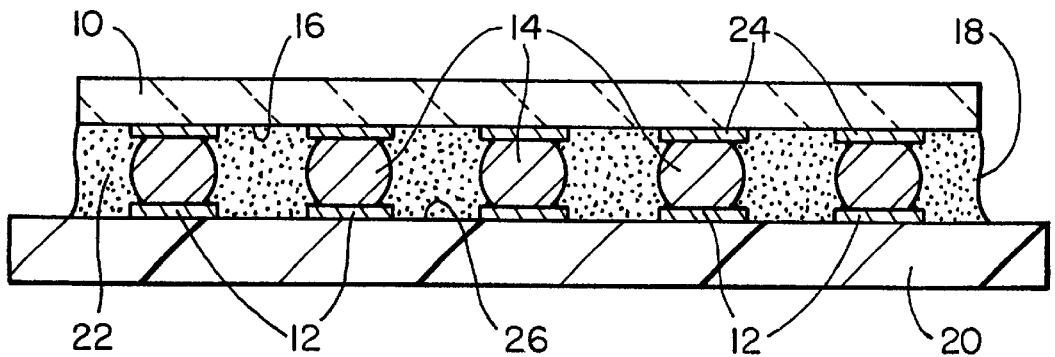
FIG_3

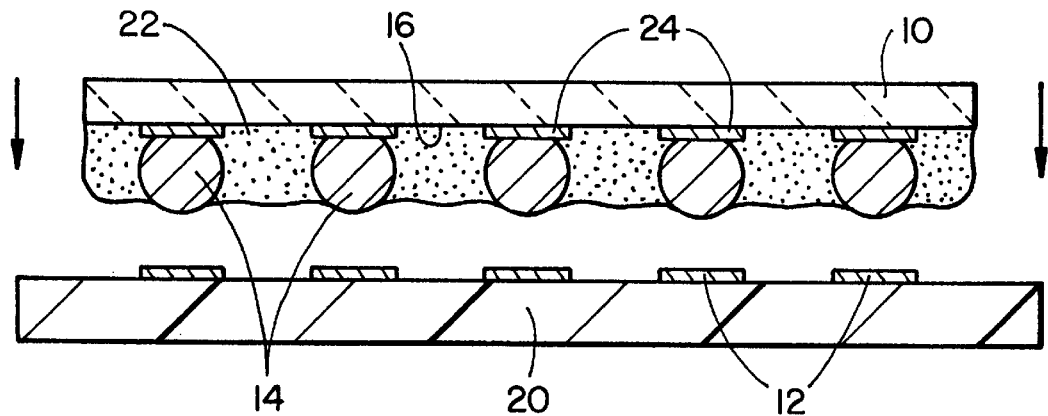
FIG_4
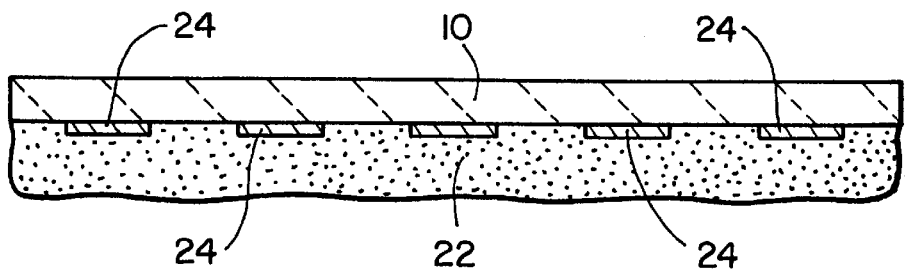
FIG_5
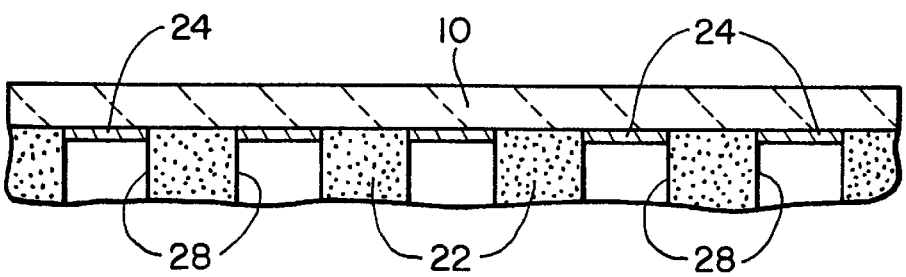
FIG_6

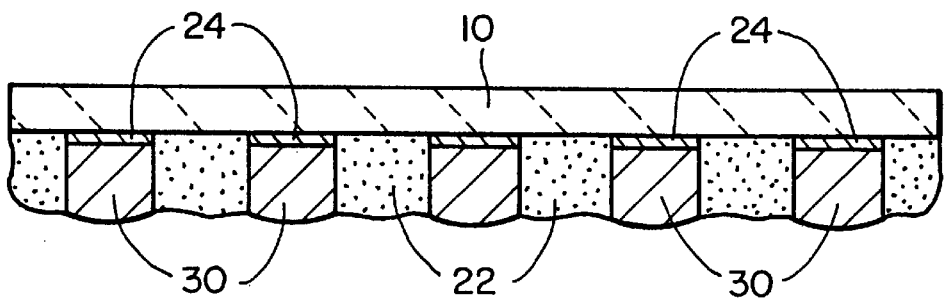
FIG_7
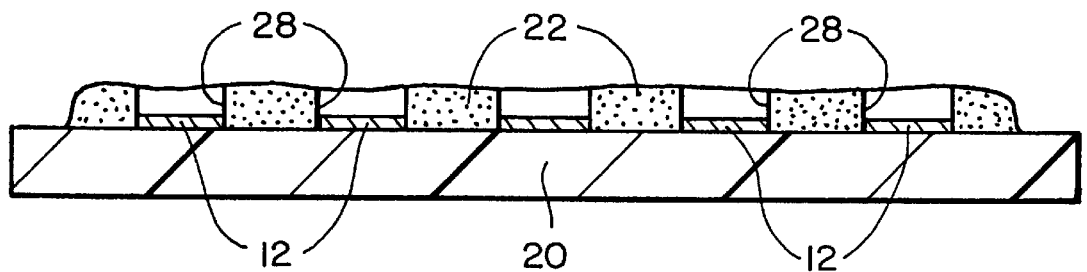
FIG_8
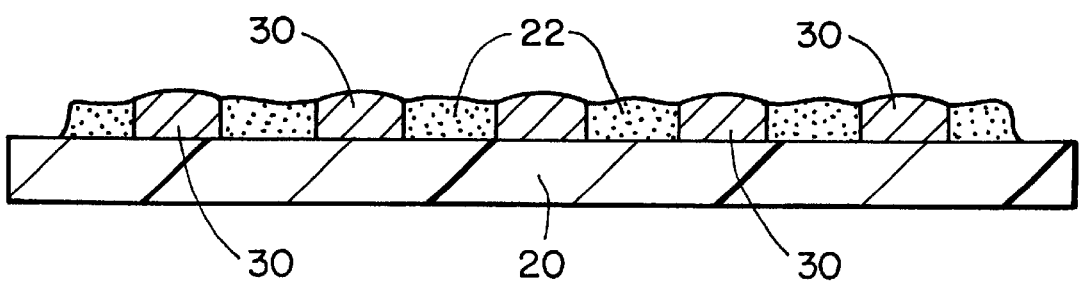
FIG_9

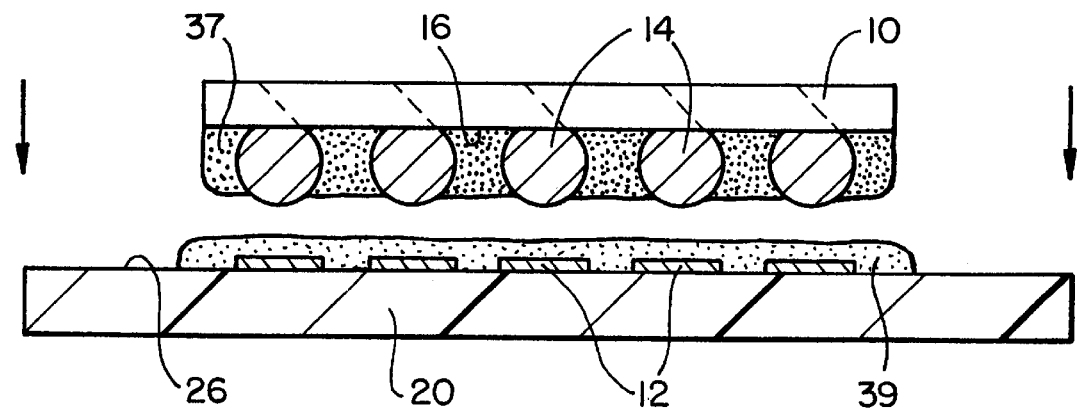
FIG_10
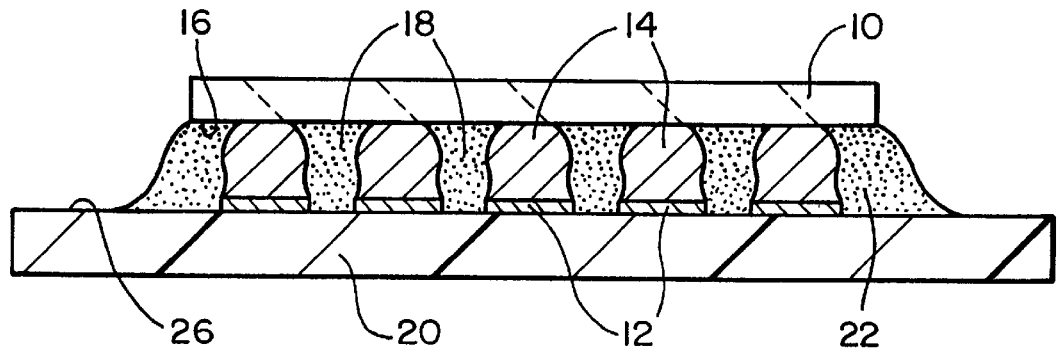
FIG_11
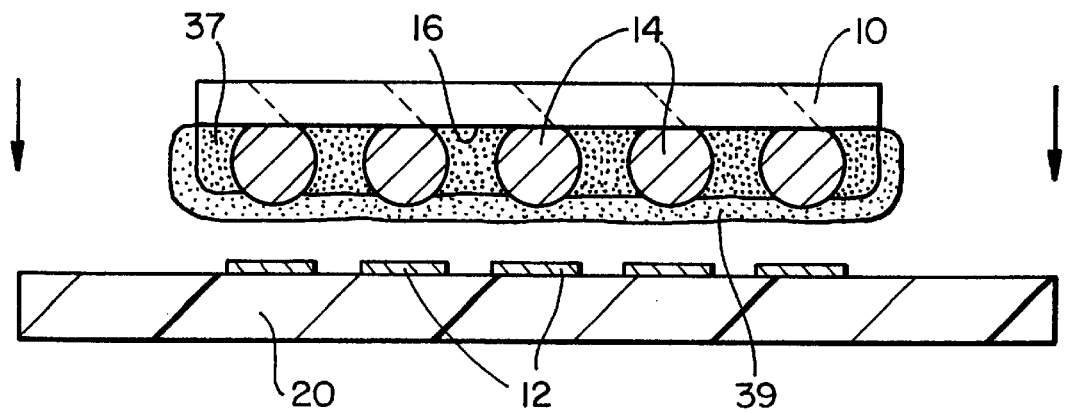
FIG_12

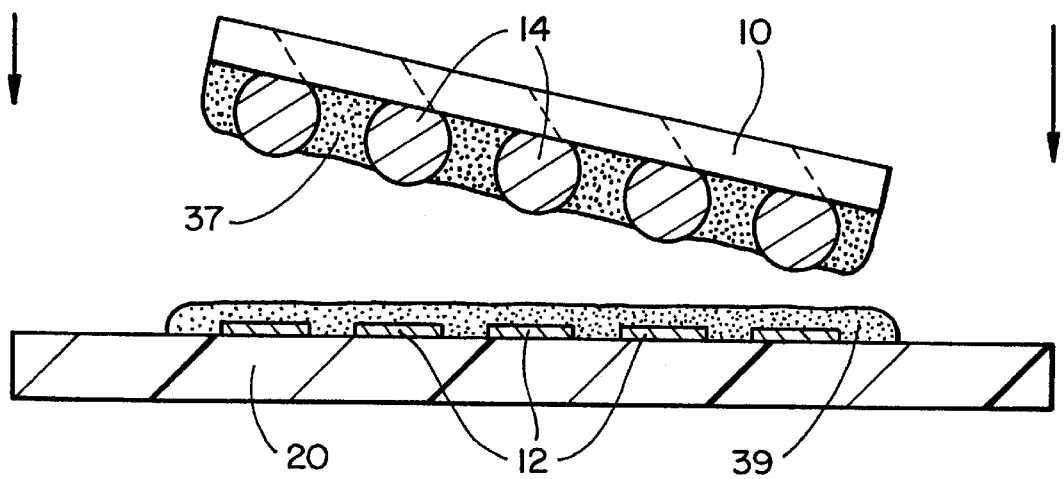
FIG_13
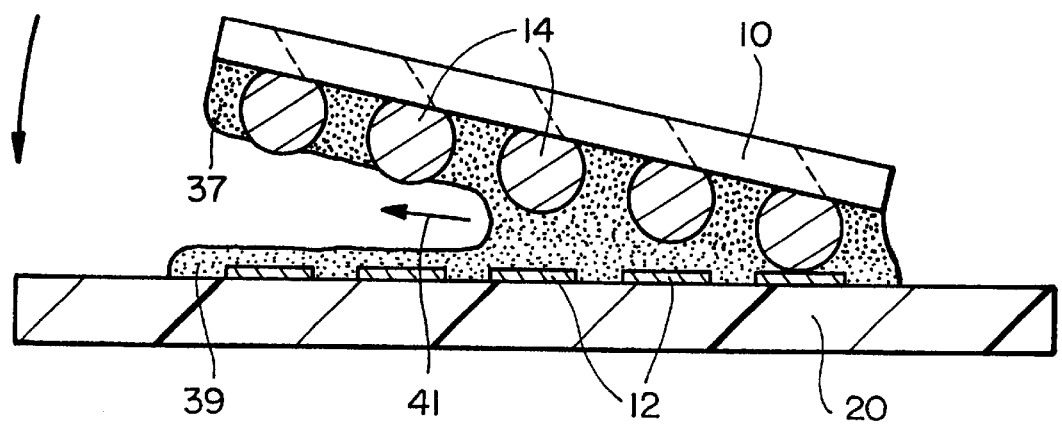
FIG_14

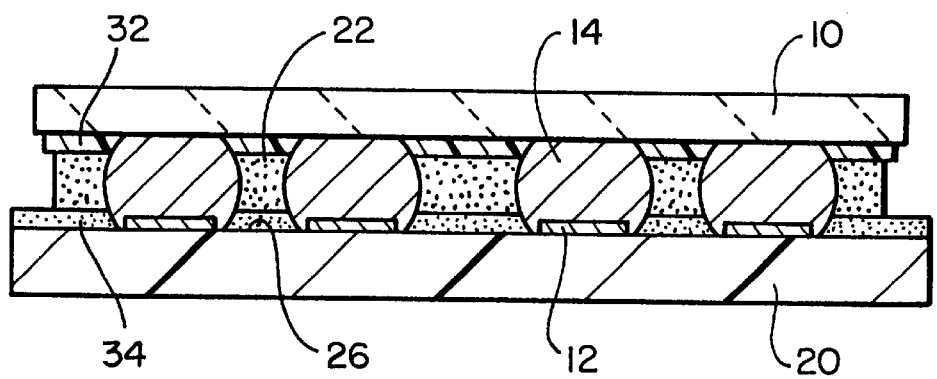
FIG_15
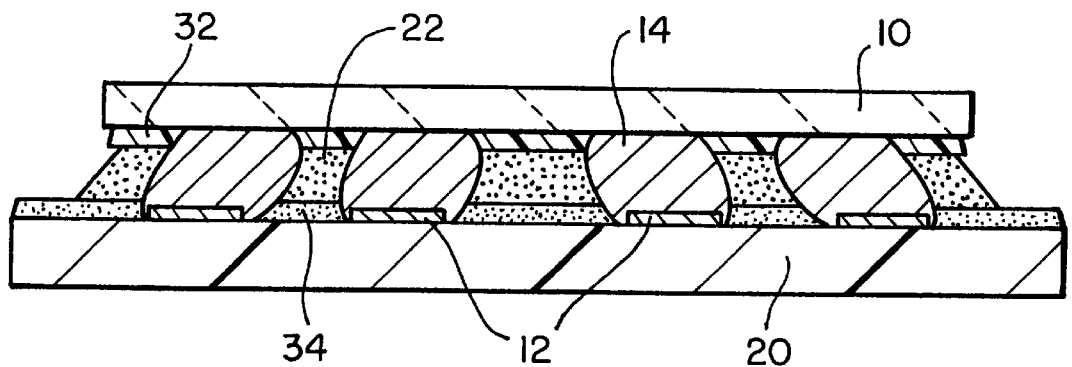
FIG_16
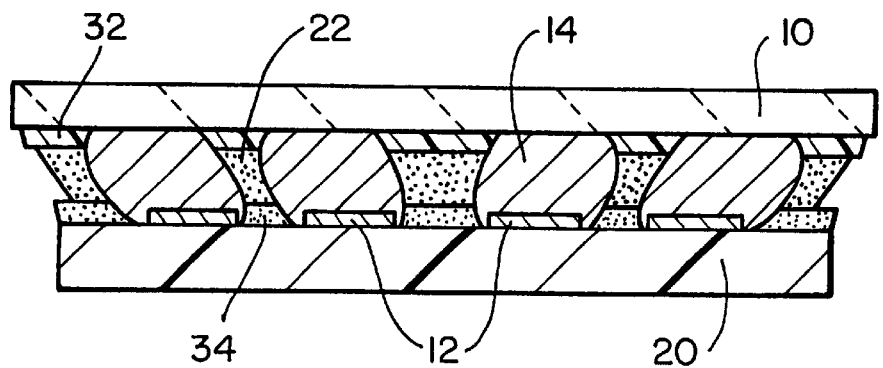
FIG_17

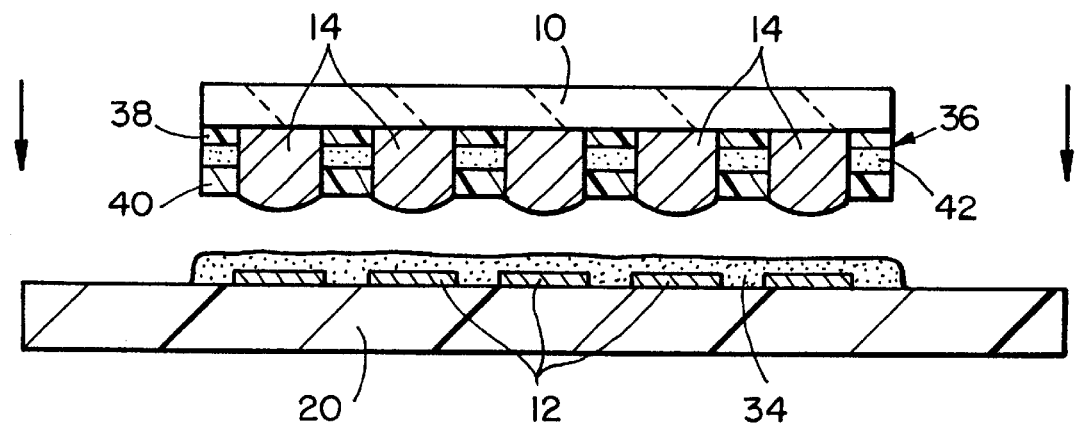
FIG_18
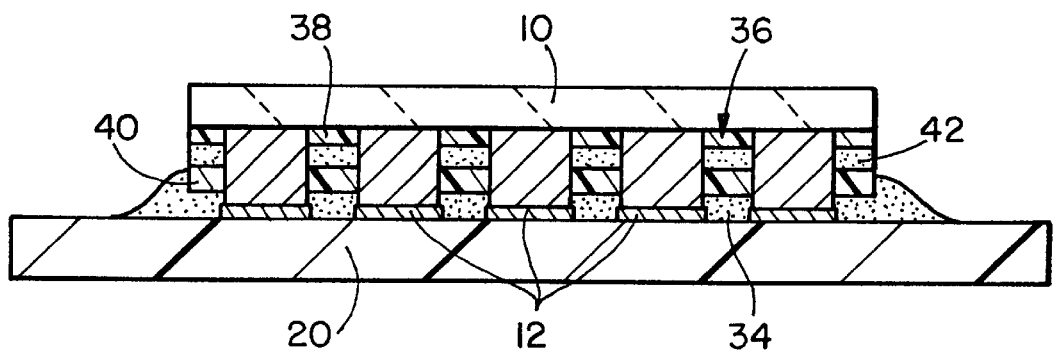
FIG_19
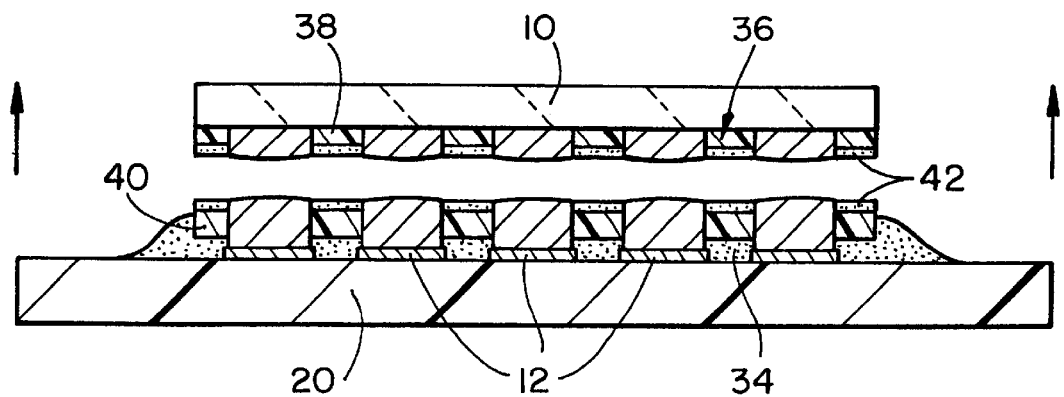
FIG_20

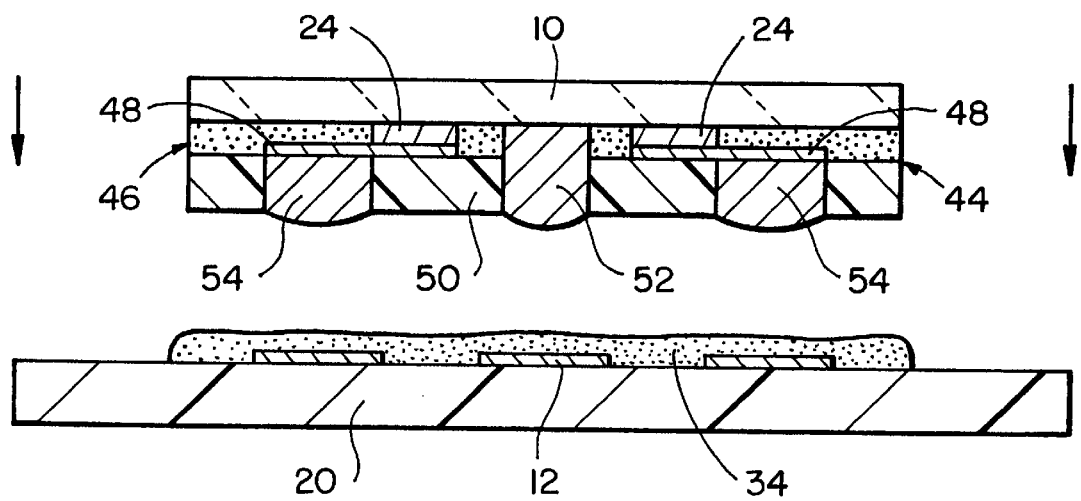
FIG_21
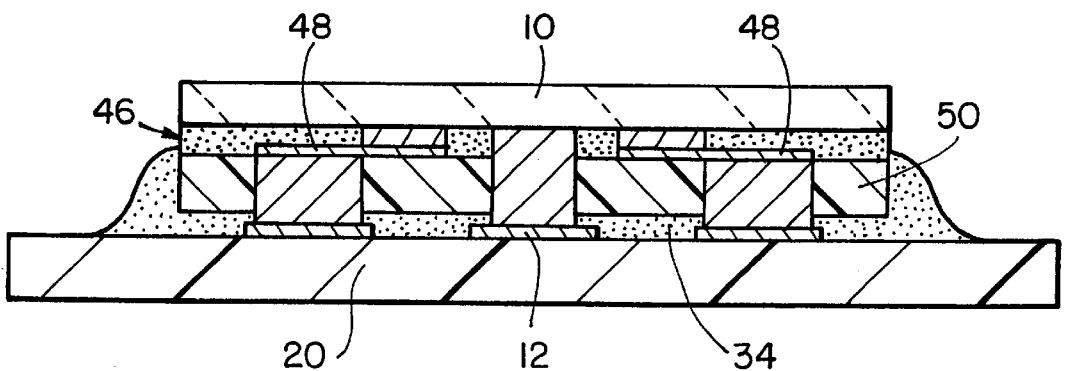
FIG_22

SEMICONDUCTOR FLIP-CHIP PACKAGE AND METHOD FOR THE FABRICATION THEREOF

This application is a divisional of application Ser. No. 09/120,172 filed Jul. 21, 1998 now U.S. Pat. No. 6,121,689.

This application claims the benefit of U.S. Provisional Application No. 60/053,407, filed Jul. 21, 1997, and No. 60/056,043, filed Sep. 2, 1997, and incorporates herein the disclosures of those applications in their entirety.

The U.S. Government has a paid-up license in this invention and the right in limited circumstances to require the patent owner to license others on reasonable terms as provided for by the terms of contract no. N00164-96-C-0089 awarded by Defense Advanced Research Projects Agency.

FIELD OF THE INVENTION

This invention relates generally to semiconductor chips electrically and mechanically connected to a substrate, particularly to flip-chip configurations.

BACKGROUND OF THE INVENTION

Flip-chip technology is well known in the art. A semiconductor chip having solder bumps formed on the active side of the semi-conductor chip is inverted and bonded to a substrate through the solder bumps by reflowing the solder. Structural solder joints are formed between the semiconductor chip and the substrate to form the mechanical and electrical connections between the chip and substrate. A narrow gap is left between the semi-conductor chip and the substrate.

One obstacle to flip-chip technology when applied to polymer printed circuits is the unacceptably poor reliability of the solder joints due to the mismatch of the coefficients of thermal expansion between the chip, having a coefficient of thermal expansion of about 3 ppm/°C., and the polymer substrate, e.g. epoxy-glass having a coefficient of thermal expansion of about 16 to 26 ppm/°C., which causes stress build up in the solder joints. Because the structural solder joints are small, they are thus subject to failures. In the past, the solder joint integrity of flip-chip interconnects to a substrate has been enhanced by underfilling the volume between the chip and the substrate with an underfill encapsulant material comprised of a suitable polymer. The underfill material is typically dispensed around two adjacent sides of the semiconductor chip, then the underfill material slowly flows by capillary action to fill the gap between the chip and the substrate. The underfill material is then hardened by baking for an extended period. For the underfill encapsulant to be effective, it is important that it adhere well to the chip and the substrate to improve the solder joint integrity. Underfilling the chip with a subsequently cured encapsulant has been shown to reduce solder joint cracking caused by thermal expansion mismatch between the chip and the substrate. The cured encapsulant reduces the stresses, induced by differential expansion and contraction, on the solder joints.

The underfill process, however, makes the assembly of encapsulated flip-chip printed wire boards (PWB) a time consuming, labor intensive and expensive process with a number of uncertainties. To join the integrated circuit to the substrate, a flux, generally a no-clean, low residue flux, is placed on the chip or substrate. Then the integrated circuit is placed on the substrate. The assembly is subjected to a solder reflowing thermal cycle, soldering the chip to the substrate. The surface tension of the solder aids to self align the chip to the substrate terminals. After reflow, due to the close proximity of the chip to the substrate, removing flux residues from under the chip is such a difficult operation that it is generally not done. Therefore the flux residues are generally left in the space between the chip and the substrate. These residues are known to reduce the reliability and integrity of the encapsulant.

After reflow, underfill encapsulation of the chip generally follows. In the prior art, the polymers of choice for the underfill encapsulation have been epoxies, the coefficient of thermal expansion and moduli of the epoxies being adjusted with the addition of inorganic fillers. To achieve optimum reliability, a coefficient of thermal expansion in the vicinity of 25 ppm/°C. is preferred and a modulus of 4 GPa or more. Since the preferred epoxies have coefficient of thermal expansions exceeding 80 ppm/°C. and moduli of less than 4 GPa, the inorganic fillers selected generally have much lower coefficient of thermal expansions and much higher moduli so that in the aggregate, the epoxy-inorganic mixture is within the desired range.

The underfill encapsulation technique of the prior art has four principal disadvantages:

1. The reflowing of the solder bump and then underfilling and curing the encapsulant is a multi-step process that results in reduced production efficiency;
2. To underfill a flip-chip assembly takes too long because the material must flow through the tiny gap between the chip and the substrate;
3. The flux residues remaining in the gap reduce the adhesive and cohesive strengths of the underfill encapsulating adhesive, affecting the reliability of the assembly; and
4. As the size of chips increase, the limiting effect of capillary action becomes more critical and makes the encapsulation procedure more time consuming, more susceptible to void formation and to the separation of the polymer from the fillers during application.

Clearly, many improvements to this process are feasible to increase reliability, reduce the time required and decrease the likelihood of producing a void in the encapsulant while providing the required low coefficient of thermal expansion and high modulus.

Other prior art methods of encapsulating the chip have attempted to overcome the above limitations by applying the encapsulating resin through a hole in the substrate located near the center of the chip. After the soldering and cleaning operations, the encapsulating resin is forced through the hole and around the periphery of the chip to ensure complete coverage of the chip surface. This method suffers from the need to reserve an area in the center of the substrate that is free of circuitry in order to provide an unused space for the hole. It also does not eliminate the problems of entrapped air bubbles.

Another prior art method in U.S. Pat. No. 5,128,746 (Pennisi) teaches a method wherein an adhesive material including a fluxing agent is applied to the chip or substrate. The chip is positioned on the substrate and the solder bumps are reflowed. During the reflow step, the fluxing agent promotes wetting of the solder to the substrate metallization pattern and the adhesive material is cured, mechanically interconnecting and encapsulating the substrate to the component. The limitation of this technique is that in order for the molten solder to readily wet the substrate metallization and also to allow the, solder, through surface tension, to self-align the chip bumps to the substrate metallization pattern, the material must maintain very low viscosity during the reflow step. But the viscosity of these materials is severely increased by the presence of the required inorganic fillers. As a result, this approach has failed to produce a material that can serve as both the flux and the encapsulant with the required low coefficient of thermal expansion and high modulus for optimum reliability.

Referring to FIGS. 1 and 2, underfilling the chip 100 with a subsequently hardened encapsulant 102 has been shown to reduce solder joint cracking caused by thermal expansion mismatch between the chip and the substrate 104. The hardened encapsulant 102 transfers the stresses, induced by differential expansion and contraction, from the solder joints 106 to deformation of the chip 100 and substrate 104 as shown in FIG. 1 for expansion-induced strain at elevated temperatures and FIG. 2 for contraction-induced strain at reduced temperatures. In other words, the main effect of the hardened encapsulant during thermal expansion or contraction is to effectively force the chip and the substrate to take up the stress caused by the coefficients of thermal expansion mismatch by bending and bulging the chip and substrate. This bending and bulging reduces the stress on the solder joints and virtually eliminates solder fatigue failure.

Unfortunately, the effect of the encapsulant bending the substrate and the chip causes its own new set of problems. One such problem is that the bending makes the chips susceptible to cracking. Another such problem is that the degree of stress relief is highly dependent on the flexibility of the under-lying substrate and is thus an unpredictable function of the design of the printed circuit. Another limitation is that relying on such bending for stress relief on the solder joints prevents the placement of flip chips directly opposite one another on a double-sided printed circuit.

Another limitation of prior art flip-chip attachment is the difficulty of performing rework. Chip removal, once underfill has been performed, is very destructive to both the printed circuit board and the chip. Rework is almost impossible with prior art materials and processes. For example, the prior art procedure for removing an encapsulated die from a printed wire board is to grind it off manually.

Another limitation of the prior art is the expense of applying solder bumps to a chip. The solder bumps have been applied to chips by one of several methods. Coating the solder on the chip bumps by evaporation of solder metals through a mask is one such method. This method suffers from 1) long deposition times, 2) limitations on the compositions of solder that can be applied to those metals that can be readily evaporated, and 3) evaporating the metals over large areas where the solder is ultimately not wanted. Also, since most solders contain lead, a toxic metal, evaporation involves removal and disposal of excess coated lead from equipment and masks. Another common method in the prior art is electroplating of the solder onto the chip pads through a temporary sacrificial mask. Electroplating is a slow and expensive process that also deposits the solder over large areas where the solder is ultimately not wanted. Another method is to screen print solder paste on the chips pad through a stencil, then reflowing the solder to form a ball or bump on the pad. This technique is limited to bump dimensions that can be readily stencil printed, so it is not practical in bump pitches of 25 microns or less.

Another limitation of the prior art is the difficulty in distributing electrical signals from the small dimension of the chip to the large dimensions of the substrates. Most chips are manufactured with the electrical interconnection pads around their periphery with a pad pitch of 0.25 mm or less. On the other hand, printed circuits are manufactured with pad pitches of 0.25 mm and larger. This discrepancy in dimensions requires that the chip-to-substrate interconnection provide some method of redistributing the chip pad locations over a larger area so that they can match the dimensions of the printed circuit. Today, this discrepancy is bridged by creating expensive redistribution layers on the printed circuit. Few manufacturers are able to produce printed circuits at the tight dimensional tolerances required for redistribution, but those who are capable of doing so achieve this with significant production yield penalties. Another method to bridge the dimension discrepancy involves complete redesign of the chip to redistribute the electrical pads over the entire area of the chip, an expensive procedure that chip manufacturers generally want to avoid.

SUMMARY OF THE INVENTION

In one aspect of the present invention there is provided a chip with underfilling encapsulant and separate discrete solder bumps pre-coated and pre-assembled on the chip for assembly to a substrate. This configuration provides a simple, cost-effective assembly procedure wherein the chip/encapsulant/discrete solder bump combination is placed on the substrate and subsequently heat is applied so that the solder is reflowed while simultaneously the encapsulant hardens, without the labor intensive underfill steps of the prior art.

In another aspect of the present invention there is provided a chip precoated with underfilling encapsulant having holes therein which expose metallized contact pads on the active surface of the chip. The holes are subsequently filled with molten solder which is then cooled and hardened to create the chip/encapsulant/discrete solder bump assembly. The assembly can be placed on a substrate and subsequently, the solder is reflowed while simultaneously the encapsulant hardens, eliminating the labor intensive underfill steps of the prior art. Alternatively, the chip/encapsulant/discrete solder bump assembly is coated with a thin layer of a flux adhesive and, subsequently, the solder is reflowed while simultaneously the flux adhesive and encapsulant harden.

In another aspect of the present invention there is provided a chip precoated with underfilling encapsulant having holes therein which expose metallized contact pads on the active surface of the chip. The holes are subsequently filled with an electrically conductive adhesive to create a chip/encapsulant/conductive adhesive bump assembly. The assembly can be placed on the substrate and subsequently the encapsulant and conductive adhesive are simultaneously hardened, without the labor intensive underfill steps of the prior art.

The present invention also provides a substrate precoated with the encapsulant having holes therein which expose the metallized solder pads on the substrate. The holes are subsequently filled with molten solder or electrically conductive adhesive which is then cooled and hardened prior to attachment of the chip to the substrate by reflow. In another embodiment, the substrate has encapsulant and separate discrete solder columns pre-assembled thereon.

In one aspect of the present invention, there is provided a first portion of an underfilling encapsulant and separate discrete solder bumps pre-coated and pre-assembled on a chip for assembly to a substrate. The first portion of encapsulant can be either a solid or a thick liquid, partially or fully uncured. A second portion of the encapsulant is applied to the substrate. The first portion of the encapsulant is filled, preferably highly filled, with a filler material to produce a reduced coefficient of thermal expansion and increased modulus. The second portion of the encapsulant is either lightly filled or completely devoid of filler material. At least the second portion of the encapsulant comprises an adhesive material with solder fluxing properties, for example, an adhesive flux. The first portion of the encapsulant can comprise a similar material or a conventional epoxy. The first portion is filled with a filler having a lower coefficient of thermal expansion and higher modulus than the encapsulant material without filler to increase the encapsulant's modulus and reduce its coefficient of thermal expansion. The invention provides a simple, cost-effective assembly procedure wherein the chip/first portion of encapsulant/discrete solder bump combination is placed on the substrate/second portion of encapsulant combination and subsequently heat is applied so that the solder is reflowed while simultaneously the encapsulant cures, without the labor intensive, time-consuming underfill steps of the prior art. Preferably, the second portion constitutes a relatively thin layer in the overall encapsulant structure which somewhat intermixes with the first portion during cure and has minimal effect on the reliability of the flip-chip structure, despite the second portion having generally a lower modulus and higher coefficient of thermal expansion than the first portion. An advantage of the present invention is that the lower viscosity of the unfilled or lightly filled second portion during the reflow process allows the solder to flow without impediment from the thick viscosity of the first portion of the encapsulant. The present invention provides a low coefficient of thermal expansion and high modulus in the first portion of the encapsulant while at the same time achieving good solder wetting and chip self aligning in the second portion of the encapsulant.

In another aspect of the present invention, the chip/first portion of encapsulant/discrete solder bump assembly described above is coated with a thin layer of the second portion of the encapsulant which is either lightly filled or completely devoid of filler material. Placement of the chip, solder reflow and adhesive cure follows as described above.

In another aspect of the present invention, there is provided a method for placing a flip-chip onto a substrate that avoids entrapment of gas bubbles or creation of voids. The chip, having the first portion of encapsulant thereon, is oriented at an angle to the substrate having the second portion thereon, then pivoted about the first point of contact until the solder bumps on the chip are in contact with the solder pads on the substrate, creating an underfill of encapsulant material as the chip is pivoted while expelling the gas from between the chip and substrate.

Another aspect of the present invention provides a chip with underfilling encapsulant pre-coated and pre-assembled on the chip for assembly to a substrate, wherein the encapsulant consists of more than one layer, each layer performing one or more distinct functions such as attachment, stress distribution, electrical redistribution, reworkability, adhesion, or other functions. The bulk of the encapsulant, consisting of one or more layers, is applied and partially or fully hardened prior to assembly of the chip on the substrate. Holes therein which expose metallized contact pads on the active surface of the chip are subsequently filled with solder or an electrically conductive adhesive as previously described to create an encapsulated subassembly. Then a flux adhesive is applied between the chip/encapsulant/solder bump combination and the substrate which can be fully hardened after or when the chip/encapsulant/solder bump combination is placed on the substrate and the solder is reflowed.

Removal of the chip from the substrate is made possible by incorporating in the pre-coated multi-layer encapsulant a polymer layer that can be remelted even after the chip has been assembled to the substrate. Remelting the solder and the polymer encapsulant layer allows removal of the chip for repair or replacement after assembly or for test and burn-in of the chip prior to final assembly. Thus the chip can be disassembled from the substrate without damage to either chip or substrate.

In another aspect of the present invention there is provided a redistribution of the chip's electrical interconnection pads by incorporating in the pre-coated multilayer encapsulant an electrical redistribution layer comprising a thin printed circuit layer with electrical circuitry thereon. The interconnect pads on the chip are attached by solder bumps, conductive adhesive or wire bonds to the redistribution layer. The redistribution layer is subsequently encapsulated. Holes in the encapsulant expose metallized contact pads on the active surface of the redistribution layer. The holes are subsequently filled with solder as previously described. Then a flux adhesive layer is applied between the chip/encapsulant/redistribution layer subassembly and the substrate. The flux adhesive is applied remaining unhardened until the subassembly is placed on the substrate and the solder is reflowed.

Another aspect of the present invention also provides within the precoated encapsulant a novel compliant flexible structure wherein the solder and encapsulant expand or contract laterally without cracking or delaminating upon heating or cooling of the chip and substrate. The novel encapsulant mainly provides the adhesive mechanical bond required to hold the chip on the substrate while the solder mainly provides the electrical interconnection required between the chip and the substrate.

The compliant solder and flexible encapsulant of the present invention absorb the stress caused by the mismatched coefficients of thermal expansion without relying on bending of the chip and substrate. Since the mechanical adhesion of the chip to the substrate relies primarily on the encapsulant, a relatively soft, fatigue-less, highly pliable solder is used for the solder bumps to provide the electrical interconnection of the chip with the substrate. The compliant solder may have relatively weak mechanical properties on its own, therefore the encapsulant provides the mechanical strength. Relieving the solder of its mechanical tasks allows the use of soft, ductile and fluid-like solders that deform laterally with the expansion and contraction of the structure without the fatigue cracking normally experienced by conventional solders.

Another embodiment of the present invention also provides within the novel compliant encapsulant previously described a compliant conductive adhesive which expands or contracts laterally upon heating or cooling to absorb the stresses created by the mismatch in the coefficients of thermal expansion and prevent bending of the chip and substrate. Independent of each other, the structural properties of the novel encapsulant provides the mechanical connection required in the structure while the electrical properties of the compliant conductive adhesive provides the required electrical connection between the chip and the substrate.

The semiconductor chip package structures of the present invention provide, among other advantages, simple chip placement followed by reflow without labor intensive underfill steps; a solder bumped or conductive adhesive bumped chip or substrate with an encapsulant pre-attached, with the encapsulant performing a mechanical function and the solder or conductive adhesive performing an electrical function; a pre-coated chip encapsulant of two or more layers, each layer performing a distinct function of attachment or reworkability; a reworkable flip chip assembly by means of a remeltable polymer in the encapsulant; an electrical redistribution layer within the encapsulant; a low-cost method for applying the solder bumps to a flip chip or flip chip substrate by creating holes in a pre-coated encapsulant; and a low-cost method for applying the conductive adhesive bumps to a flip chip or substrate by creating holes in a pre-coated encapsulant; and a compliant chip understructure that includes a fatigue-less solder or conductive adhesive.

BRIEF DESCRIPTION OF THE DRAWINGS

FIG. 1 is a diagrammatic representation of a prior art underfilled flip-chip structure under expansion-induced strain at elevated temperatures.

FIG. 2 is a diagrammatic representation of a prior art underfilled flip-chip structure under contraction-induced strain at reduced temperatures.

FIG. 3 is an assembled flip-chip structure in accordance with one embodiment of the present invention.

FIG. 4 is a diagrammatic representation of one embodiment for forming a flip-chip structure.

FIGS. 5–7 are diagrammatic representations of another embodiment for forming a flip-chip structure.

FIGS. 8 and 9 are diagrammatic representations of another embodiment for forming a flip-chip structure.

FIG. 10 is a diagrammatic representation of a flip-chip structure wherein the first portion of the encapsulant material is applied to the bumped chip and the second portion is applied to the substrate.

FIG. 11 is a diagrammatic representation of the flip-chip structure of FIG. 10 after assembly.

FIG. 12 is a diagrammatic representation of a flip-chip structure wherein the first portion of the encapsulant material is applied to the bumped chip and the second portion is applied over the first portion.

FIGS. 13 and 14 illustrate a method for placing a flip-chip onto a printed circuit board that avoids entrapment of gas bubbles or formation of voids in the encapsulant.

FIG. 15 is a diagrammatic representation of a compliant flip-chip structure in accordance with the present invention.

FIG. 16 is a diagrammatic representation of the compliant flip-chip structure of FIG. 15 under expansion-induced strain at elevated temperatures.

FIG. 17 is a diagrammatic representation of the compliant flip-chip structure of FIG. 15 under contraction-induced strain at reduced temperatures.

FIGS. 18 and 19 are diagrammatic representations of yet another embodiment for forming a flip-chip structure.

FIG. 20 is a diagrammatic representation of the reworkability of the flip-chip structure of FIGS. 18 and 19.

FIGS. 21 and 22 are diagrammatic representations of still another embodiment of a flip-chip structure.

DETAILED DESCRIPTION OF THE PREFERRED EMBODIMENTS

Referring to FIG. 3, an integrated circuit chip 10 is shown mounted on a substrate 20. A plurality of solder pads 12 on top surface 26 of the substrate 20 are arranged to receive corresponding solder bumps 14 connected to the contact pads 24 of the chip 10. Each of the solder pads 12 is metallized so as to become solderable and electrically conductive to provide an electrical interconnection between the chip 10 and the substrate 20. With this flip-chip mounting arrangement, a gap 18 is formed around the solder bumps 14 between the top surface 26 of the substrate 20 and the bottom surface 16 of the chip 10. The gap 18 typically varies from 2 to 6 mils. The gap 18 is completely filled with an encapsulant material 22. In one embodiment of the invention, the encapsulant material 22 is a compliant polymer composition. One preferred compliant composition, which is not meant to limit the invention but only by way of example, is a compliant polyimide-siloxane co-polymer such as SumiOxy® 2421-A6-SP available from Oxychem, Grand Island, N.Y. Alternatively, in another embodiment of the instant invention, the encapsulant material 22 is a rigid polymer composition. One preferred composition, which is not meant to limit the invention but only by way of example, is an anhydride-cured epoxy resin. Other types of encapsulants known to those skilled in the art are possible. The encapsulant material 22 is applied to the chip in either liquid or adhesive tape form, then hardened.

In another embodiment, the chip 10 having separate discrete solder bumps 14 pre-assembled thereon is precoated with the encapsulant material 22 prior to assembly to the substrate 20 (FIG. 4) to alleviate the underfill problems of the prior art processes and to overcome the performance limitations of substrates which are pre-coated with a homogeneous combination of adhesive material, fluxing agent and curing agent or chips which are pre-coated with a homogeneous combination of adhesive material, fluxing agent, curing agent and metal particles. The separate discrete solder bumps with encapsulant material therearound provide superior electrical performance compared to a distribution of metal particles spread throughout an encapsulating material. The encapsulating material 22 is uniformly spread across the surface 16 of the chip 10 between the solder bumps 14 covering the remainder of the chip 10. The chip 10 is then positioned so that the solder bumps 14 are facing the substrate 20 and aligned with the solder pads 12 of the substrate. In one embodiment, the solder bumps 14 protrude beyond the encapsulant after the encapsulant coating step. In an alternate embodiment, the solder bumps 14 are covered by the encapsulant 22 wherein the encapsulant is ground, melted away, shaved off or otherwise removed to expose the solder bumps prior to attachment to the substrate. The encapsulant 22 and solder bumps 14 are moved into intimate contact with the substrate 20 and solder pads 12, respectively. The assembly is heated to cure the encapsulant 22 and reflow the solder using infrared reflow technology, preferably in a nitrogen blanket to attach the solder bumps 14 to the contact pads 12 of the substrate 20. Other heating and reflow techniques, known to those skilled in the art, are possible. The encapsulant 22 provides a continuous seal between the chip 10 and the substrate 20.

In yet another embodiment (FIG. 5), the circuitry on the bottom surface 16 of the chip 10 is coated with the encapsulant 22 then the contact pads 24 are exposed by making vias 28 through the encapsulant 22 (e.g., either with a laser, plasma, chemical etching, a drill or by photo-imaging and development or any other method known to one skilled in the art) (FIG. 6). The vias 28 within the encapsulant 22 are then filled with solder 30 (FIG. 7) or a conductive adhesive as described in U.S. Pat. No. 5,376,403 which is forced into the holes by solder injection molding, solder jetting, screen printing, or other methods known to those skilled in the art. With any of these embodiments, the solder 30 is reflowed to form the electrical connection between the chip and the substrate while the encapsulant 22 bonds to the substrate 20 and the chip 10 to form the structural connection. As can be easily appreciated by one of ordinary skill in the art, any of the above-described embodiments can be modified by pre-coating the substrate 20 (rather than the chip) with the encapsulant 22 or encapsulant 22 and solder 30 combination as shown in FIGS. 8 and 9, respectively.

Referring to FIG. 10, an integrated circuit chip 10 is shown mounted on a substrate 20 in accordance with another embodiment of the present invention. A plurality of solder pads 12 on top surface 26 of the substrate 20 are arranged to receive corresponding solder bumps 14 connected to the contact pads (not shown in this embodiment) of the chip 10. Each of the solder pads 12 is metallized so as to become solderable and electrically conductive to provide an electrical interconnection between the chip 10 and the substrate 20. With this flip-chip mounting arrangement, a gap 18 is formed around the solder bumps 14 between the top surface 26 of the substrate 20 and the bottom surface 16 of the chip 10. The gap 18 is completely filled with an encapsulant material 22. The gap 18 typically varies from 2 to 6 mils.

FIG. 11 illustrates one embodiment for forming the flip-chip package illustrated in FIG. 10 using two pre-coated portions of encapsulant. The chip 10 having separate discrete solder bumps 14 pre-assembled thereon is precoated with the first portion 37 of an encapsulant material 22 (FIG. 10) prior to assembly to the substrate 20. The first portion 37 contains a filler material, preferably highly filled, to reduce its coefficient of thermal expansion and increase its modulus relative to the encapsulant material not having any filler. The substrate 20, having a pattern of separate discrete solderable metal pads 12 thereon, is precoated with the second portion 39 of the encapsulant material prior to assembly with the chip 10. The second portion 39 of the encapsulant material contains little or no filler material. The two-layer configuration alleviates the underfill problems of the prior art processes and overcomes the performance limitations of substrates which are pre-coated with a homogeneous combination of adhesive material, fluxing agent and curing agent or chips which are pre-coated with a homogeneous combination of adhesive material, fluxing agent, curing agent and metal filler particles.

The first portion 37 (FIG. 11) which makes up part of the encapsulating material 22 (FIG. 10) is uniformly spread across the surface 16 of the chip 10 between the solder bumps 14 to cover the remainder of the chip surface. The second portion 39 (FIG. 11) which makes up part of the encapsulating material 22 (FIG. 10) is uniformly spread across the surface 26 of the substrate 20 over the solderable metal pads 12 covering the chip region of the substrate 20. The chip 10 is then positioned so that the solder bumps 14 are facing the substrate 20 and aligned with the solder pads 12 of the substrate 20. The solder bumps 14 can protrude beyond the first portion 37 (as shown in FIG. 11) of the encapsulant after the encapsulant coating step of the chip 10. The encapsulant portion 37 and solder bumps 14 are moved into intimate contact with the encapsulant portion 39 and solder pads 12, respectively. The combination of portions 37 and 39 forms the encapsulant 22 (FIG. 10). The assembly is heated to cure the encapsulant 22 and reflow the solder using infrared reflow technology, preferably in a nitrogen blanket to attach the solder bumps 14 to the contact pads 12 of the substrate 20. Other heating and reflow techniques, known to those skilled in the art, can be used in the present invention. The encapsulant 22 provides a continuous seal between the chip 10 and the substrate 20.

FIG. 12 illustrates another embodiment for forming the flip-chip package illustrated in FIG. 10 using two precoated discrete portions of encapsulant. The chip 10 having separate discrete solder bumps 14 pre-assembled thereon is pre-coated with the first portion 37 of an encapsulant material 22 (FIG. 10) prior to assembly to the substrate 20. The first portion 37 contains a filler material, preferably highly filled, to reduce its coefficient of thermal expansion and increase its modulus. The first portion 37 is then precoated with the second portion 39 of the encapsulant material prior to assembly with the substrate 20. The second portion 39 of the encapsulant material contains little or no filler material. The first portion 37 (FIG. 12) which makes up part of the encapsulating material 22 (FIG. 10) is uniformly spread across the surface 16 of the chip 10 between the solder bumps 14 to cover the remainder of the chip surface. The second portion 39 (FIG. 12) which makes up part of the encapsulating material 22 (FIG. 10) is uniformly spread over the prior applied first portion 37. The chip 10 is then positioned so that the solder bumps 14 are facing the substrate 20 and aligned with the solder pads 12 of the substrate 20 as described before. The encapsulant portions 37 and 39 and solder bumps 14 are moved into intimate contact with the substrate 20 and solder pads 12. The combination of portions 37 and 39 forms the encapsulant 22 (FIG. 10). The assembly is heated to cure the encapsulant 22 and reflow the solder as described before to attach the solder bumps 14 to the contact pads 12 of the substrate 20.

FIGS. 13 and 14 illustrate an alternate embodiment for attachment of portion 37 and solder bumps 14 with the portion 39 and solder pads 12, respectively. This method is described with respect to the embodiment shown in FIG. 11, but is equally applicable to the embodiment shown in FIG. 12. The chip 10 is initially oriented at an angle to the substrate 20. As the encapsulant portion 37 and the solder bump on the end of the chip 10 are moved into intimate contact with the portion 39 and solder pad 12, the chip is pivoted about the first point of contact until all of the solder bumps 14 are in contact with the solder pads 12. In this manner, any gas that could possibly be entrapped between the first portion 37 and the second portion 39 is expelled as indicated by arrow 41 in FIG. 14 to prevent formation of voids in the encapsulant.

Generally, the chip 10 is passivated with a thin layer of either silicon nitride, polyimide, or benzocyclobutene. To adhere well to the passivation layer (not shown) on the chip 10, a chip bonding layer (not shown in this embodiment) may incorporate a coupling agent (not shown) such as a silane. To adhere well to the encapsulant 22, the coupling agent (not shown) provides a chemically compatible moiety for bonding. For example, the preferred moieties can be epoxides, anhydrides, hydroxyls, or other moiety that readily bonds to the encapsulant 22.

The adhesive of the first portion 37 can be either an adhesive flux or a compatible non-fluxing adhesive. The significant properties of the first portion 37 are:

1. After cure, a coefficient of thermal expansion in the vicinity of 25 ppm/°C.;
2. After cure, a Tg above 120° C.;
3. After cure, a modulus greater than 0.1 GPa, preferably greater than 4 GPa;
4. After cure, high adhesion to the chips passivation layer that usually consists of silicon nitride, polyimide, or benzocyclobutene;
5. Solventless;
6. A chemical composition such that it does not interfere or adversely affect the properties of the second portion 39 of the encapsulant to which it will be mated; and 7. After cure, high adhesion to the second portion 39 of the encapsulant.

Since the intrinsic coefficient of thermal expansion and moduli of most polymeric adhesives do not satisfy the first or third properties above, the most distinguishing feature of the first portion 37 of the present invention is that it is filled with a high concentration of a powdered filler having a lower coefficient of thermal expansion and higher modulus, generally an inorganic material, and most preferably silica. The filler having a higher modulus and lower coefficient of thermal expansion than the adhesive alone produces an adhesive-filler aggregate having desired properties. Examples of such adhesives are Araldite CW1195US with cureer HW1196US available from Ciba Geigy Corporation and Hysol® FP4527 and Hysol® FP4511 available from the Dexter Corporation of Industry, Calif.

Preferably, the adhesive of the first portion 37 is preferably an adhesive flux. The significant property of the preferred first portion is that, in addition to the properties listed above, the preferred first portion adhesive does not diminish the flow of the solder during the solder reflowing operation. Many non-fluxing adhesives tend to either cure too quickly or react with the second portion adhesive in ways that decrease the wetting and spread of the solder during reflow. Using an adhesive flux highly filled with a powder filler that imparts the required coefficient of thermal expansion and modulus to the adhesive flux provides a first portion 37 that has little or no effect on the spread of the solder.

The embodiment of FIG. 15 is a multi-layer compliant understructure configuration having two discrete bonding layers 32 and 34 in combination with any of the above-described embodiments for the encapsulant and solder. Chip bonding layer 32 is a thin polymer, or coupling agent, with high adhesion to the chip passivation layer (not shown) on the face of the chip 10. The chip bonding layer 32 is a thin interfacial layer adhering the encapsulant material 22 to the chip 10. The substrate bonding layer 34 is a thin, adhesive flux layer adhering the encapsulant 22 to the substrate 30.

The chip bonding layer 32 has the following properties:

1) chemically bonds to the encapsulant 22 to provide high adhesive strength to the encapsulant; and 2) chemically bonds to the passivation layer on the chip 10 to provide high adhesive strength to the chip.

Generally, the chip 10 is passivated with a thin layer of either silicon nitride, polyimide, or benzocyclobutene. To adhere well to the passivation layer (not shown) on the chip 10, the chip bonding layer 32 may incorporate a coupling agent (not shown) such as a silane. To adhere well to the encapsulant 22, the coupling agent (not shown) provides a chemically compatible moiety for bonding. For example, the preferred moieties can be epoxides, anhydrides, hydroxyls, or other moiety that readily bonds to the encapsulant 22.

The substrate bonding layer or adhesive flux 34 is a composition with the following properties:

1) a strong fluxing agent that removes oxides from the metal surfaces to be soldered and promotes wetting of the metal pads to be soldered;

2) crosslinks into an adhesive polymer during the soldering operation, chemically immobilizing the fluxing agent and the flux reaction byproducts;

3) has a sufficiently low viscosity during the soldering operation that it does not impede the flow of the molten solder;

4) after curing, no cleaning or washing for flux removal is required;

5) high adhesive strength after cure;

6) corrosion resistance and resistance to degradation at soldering temperatures; and 7) does not evolve any gases that can cause voids or bubbles in the adhesive during curing.

In general terms, the substrate bonding layer or adhesive flux 34 comprises a liquid or solid composition which acts as both a primary fluxing agent and a crosslinking monomer or polymer. More specifically, the adhesive fluxes comprise the following:

1) chemical components with carboxylic acid moieties for fluxing;

2) chemical components with polymerizable moieties for crosslinking the composition;

3) a chemical or mechanical mechanism for impeding or preventing the onset of polymerization of the composition until the solder has melted and wetted all the surfaces to be soldered; and 4) optional solvents, fillers, moderating agents, surfactants, modifiers, resins and other additives performing desirable functions and generally known to those skilled in the art.

A number of compositions are known in the prior art comprising these features, such as described in U.S. Pat. Nos. 5,376,403, 5,088,189, 5,136,365 and 5,128,746. A preferred composition is directed to fluxing adhesive compositions that include a fluxing agent comprising a single active component which is capable of functioning as both a primary fluxing agent and a crosslinking monomer. Generally, depending upon the intended end use, the inventive thermally curable adhesive composition comprises (a) a fluxing agent having a carboxylic acid group and one or more carbon-carbon double bonds, (b) optionally, a crosslinkable diluent, (c) optionally, a free-radical initiator, and (d) optionally, a resin.

In addition the thermally curable adhesive composition may include a solvent for adjusting the viscosity. Other viscosity modifiers, thickeners and thixotropic agents may also be added. Fillers, such as silica powder, can be employed for increased modulus and lower thermal coefficient of expansion.

1. Fluxing Agents. The preferred fluxing agent has the structure RCOOH, wherein R comprises a moiety which include two or more carbon-carbon double bonds.

For high flux activity due to the presence of multiple carboxylic acids, the preferred fluxing agent is a carboxylic acid that is selected from the group consisting of compounds represented by Formulae I, II, III and IV and mixtures thereof, $$HOOCCH=CH(O)COR^{18}OC(O)CH=CHCOOH \qquad (I)$$

$$R^2H_2C(HCOR^n)_nCH_2OR^3 \qquad (II)$$

$$[X^1X^2X^3X^4]C \qquad (III)$$

$$R^{17}COOH \qquad (IV)$$

wherein $R^{18}$ is an alkyl having 1to 16 carbons, preferably 1 to 9 carbons, and more preferably 1 to 3 carbons, wherein n is an integer from 1 to 16 preferably an integer from 1 to 9, and more preferably an integer from 1 to 3, wherein each of $R^1$, $R^2$, . . . $R^n$, is independently selected from —C(O)CH=CHCOOH, and H, wherein $X^1$, $X^2$, $X^3$, and $X^4$, are each independently selected from —CH$_2$OH and —CH$_2$OC(O)CH=CHCOOH, and wherein $R^{17}$ is a moiety having two or more carbon-carbon double bonds and an amine moiety. The fluxing agent typically comprises about 0.01%–100%, preferably about 5%–80%, and more preferably about 10%–70% by volume of the thermally curable adhesive composition. A particularly preferred fluxing agent which has low-viscosity and high flux activity is tris (maleic acid) glycerol monoester which is described in Example 1.

The fluxing agents of the preferred flux exhibit flux activities that are superior to that of prior art polymer-fluxing agent mixtures. Since the inventive fluxing agents are intrinsically self-crosslinking, the preferred thermally curable adhesive composition does not require the use of epoxy resins for crosslinking. As a corollary, the shelf life or pot life of the preferred composition is long and its flux activity high relative to conventional polymer-fluxing mixtures that include epoxy resins.

Further, the adhesion properties, mechanical integrity, and corrosion resistance achieved with the fluxing agents are superior to those achieved with prior art polymer fluxing agents because there is no need to add aggressive fluxing activators. The inventive fluxing agents are fully cross-linked and all components thereof are chemically immobilized upon curing. Even the reaction by-products of flux deoxidization of the metals may be chemically bound in the polymer matrix.

Carboxylic acids function well as fluxing agents to remove oxides from metals. In addition, carboxylic acids are also very effective crosslinking moieties when present in their reactive form in a fluxing composition containing a suitable thermosetting resin, such as an epoxy. For this reason, in the prior art, chemical protection of the carboxylic acid was essential to achieving stability and preventing premature reactions. Protection was achieved by binding the fluxing agent with a chemically- or thermally-triggered species so that it becomes reactive only at or near the time that the solder melts. However, with the present invention, no such protection is necessary because the compositions can be formulated without any components that can crosslink with the carboxylic acid moiety. This results in a fluxing agent that can function at its full strength with the metal oxides to produce fluxing that is superior to any heretofore polymerizable fluxing agent. The flux activity of the inventive fluxing agent in some applications may be too high thereby requiring dilution of the fluxing agent to prevent formation of undesirable gaseous by-products.

With the inventive fluxing agent, the principal crosslinking mechanism occurs at the carbon-carbon double bonds existing in the fluxing agent molecule and not at the carboxylic acid groups. The carboxylic acids do not react with the double bonds, therefore on its own, in the absence of other molecules that can react with the carboxylic acid, the fluxing agent does not polymerize at ambient temperatures. It is at elevated temperatures that the double bonds begin to open and react with other opened double bonds to crosslink.

Since each fluxing agent molecule contains at least two double bonds, the molecules crosslink into polymeric networks.

By eliminating the need for a separate thermosetting resin in the flux composition, as is required in the prior art, the flux activity can be kept very high without concern about prematurely cross-linking the thermosetting resin. By crosslinking the fluxing agent itself, an adhesive having a higher glass transition temperature and lower coefficient of thermal expansion can be created without sacrificing fluxing activity.

A preferred embodiment of the fluxing agent has an amine moiety that is incorporated into the fluxing agent molecule itself. The generalized structure for carboxylic acids containing two or more carbon-carbon double bonds and also containing an amine is:

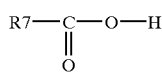

in which $R^7$ comprises at least one amine group and two carbon-carbon double bonds. For high flux activity due to the presence of multiple carboxylic acids, the presently preferred carboxylic acids containing double carbon-carbon bonds has the general structure:

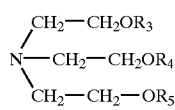

where $R^3$, $R^4$, and $R^5$ are either —H or —OCCH=CHCOOH. For its low viscosity and high flux activity, a particularly preferred amine containing fluxing agent is tris (maleic acid) triethanolamine monoester which is described in Example 2.

The fluxing agent molecules having an amine moiety can moderate each other without the addition of a separate component, as illustrated here:

The net result of this moderating mechanism is to cause the fluxing agent to gel at room temperature. Yet, as the temperature is elevated above approximately 50–100° C., these materials will liquefy readily to a low viscosity liquid, indicating the

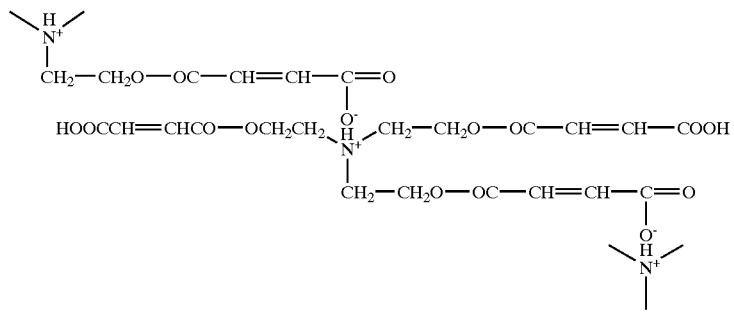

thermal disassociation of these ionic bonds. Thus the carboxylic acid moiety is then fully discharged to flux the oxidized metal surfaces at temperatures above 50–100° C.

Fluxing agents that do not contain nitrogen (e.g., amine) as represented, for example, by Formulae I, II, III, and IV, typically are liquid at ambient temperatures (~23° C.). Therefore, no solvent is required. In contrast, amine containing fluxing agents are solid or semi-solid at ambient temperatures and form gels with the addition of water or other solvent. Thus, by employing both amine and non-nitrogen containing fluxing agents and optionally including a solvent, a thermally curable adhesive composition having the consistency of a tacky gel mixture can be formulated. With the present invention, thermally curable adhesive compositions can be formulated to be in the liquid, gel, or solid state.

2. Diluents. The presence of carbon-carbon double bond(s) in the preferred fluxing agent molecule allows much flexibility in the formulation of a flux composition with exceptional thermomechanical properties. This is achieved by the addition of double bond containing diluents that can also crosslink with the preferred flux to create a superior adhesive. This technique permits the design of fluxing adhesive compositions that can attain high crosslink densities, which are desirable for good thermomechanical properties and good adhesion. Moreover, this is accomplished without the concern of premature crosslinking and reduced pot life associated with the prior art. Preferred diluents include, for example, (a) penta erythritol tetraacrylate, $C(CH_2OOCCH=CH_2)_4$, (b) triallyl-1,3,5-triazine-2,4,6 (1H,3H,5H)-trione, (c) tris[2-(acryloxy)ethyl] isocyanurate, and mixtures thereof. Diluents (b) and (c) have the following structures:

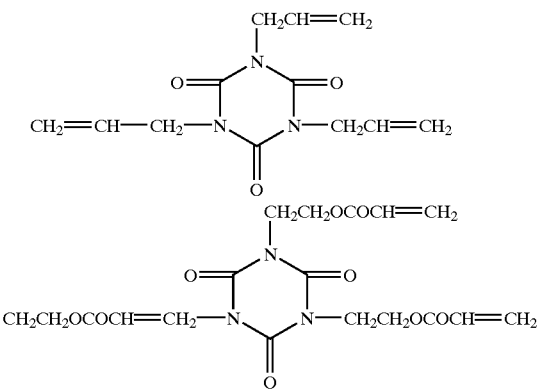

Other double bond compounds, many of which are commercially available, including, for example, diallyl phthalate and divinyl benzene can also be used. Hydrophobic diluents as described are preferred but hydrophilic diluents can also be employed when appropriate. The diluent when employed typically can comprise up to about 90%, preferably between about 5%–80%, and more preferably between about 50%–80% by volume of the thermally curable adhesive composition.

One benefit of employing hydrophobic diluents is that their presence tends to reduce the amount of water which the cured adhesive composition will absorb. The reason is that the fluxing agent, when crosslinked, will have active carboxylic groups that can attract water, even though these carboxylic groups, being part of a network, are immobile. Water acts as a plasticizer which softens the cured adhesive composition. The use of hydrophobic diluents which are crosslinked to the fluxing agent will counteract the hydrophilic effects of the carboxylic acid groups. Indeed, the cured adhesive compositions containing hydrophobic diluents can have less than 2% (wt) moisture when exposed to ambient conditions.

3. Free Radical Initiators. While the preferred thermally curable adhesive flux composition can be cured using heat alone, the cross linking reaction can be initiated and facilitated by the presence of free-radicals, including, for example, those generated by benzoyl peroxide, butyl hydroperoxide, 2,2'-azobisisobutyronitrile, and mixtures thereof. These free radical initiators or sources are commercially available.

Free-radicals can be created in-situ by exposure of the free-radical initiator to heat, radiation, or other conventional energizing sources. Introduction of an appropriate free-radical initiator can accelerate the onset of crosslinking to the desired moment in a solder reflow operation. The presence of a small amount of free-radical crosslinking initiator in the fluxing agent can be used to control the rate and the temperature of crosslinking of the fluxing agent, ensuring effective fluxing action and strong adhesion of the fluxing agent to the substrates upon curing.

The free radical initiator when employed typically comprises up to about 5%, preferably between about 0%–3%, and more preferably about 0.3%–1% by weight of the thermally curable adhesive composition.

4. Resins. The preferred thermally curable adhesive flux composition does not require resins; further, compositions that do not include resins tend to have longer pot lives and lower viscosities during solder reflow. However, as an option, a resin can be employed and it functions to increase the adhesion of the cured composition to the substrate and to increase the cohesive strength and glass transition temperature of the cured composition. The resin may be any suitable resin that is compatible (i.e., blendable) with the preferred fluxing agent. By blendable is meant that the resins do not have to be chemically bonded to the fluxing agent and/or diluent, however, preferred resins can crosslink with the carboxylic acid groups in the fluxing agent or by other reactive moieties, such as optional —OH groups, in the diluent. Resins which meet these requirements include, but are not limited to, epoxies, phenolics, novalacs (both phenolic and cresolic), polyurethanes, polyimides, bismaleimides, maleimides, cyanate esters, polyvinyl alcohols, polyesters, and polyureas. Preferred resins 1,4-cyclohexanedimethanol diglycidyl ether, 3,4-epoxycyclohexylmethyl 3,4-epoxycyclohexanecarboxylate, N,N-diglycidyl-4-glycidyl-oxyanilline, bisphenol A based epoxy resins, and mixtures thereof. These are commercially available.

Suitable compounds (including polymers) can also be modified to form resins that are blendable with the diluent and/or the carboxylic acid fluxing agent. Examples of such compounds are acrylics, rubbers (butyl, nitrile, etc.), polyamides, polyacrylates, polyethers, polysulfones, polyethylenes, polypropylenes, polysiloxanes, polyvinyl acetates/polyvinyl esters, polyolefins, cyanoacrylates, and polystyrenes. Generally, any compound can function as a resin if it can be modified to contain at least one of the following illustrative functional groups that act as reactive sites for polymerization: anhydrides, carboxylic acids, amides, amines, alcohols/phenols, nitrites, carbamates, isocyanates, sulfonamides, semicarbazones, oximes, hydrazones, cyanohydrins, ureas, phosphoric esters/acids, thiophosphoric esters/acids, phosphonic esters/acids, phosphites, phosphonamides, and sulfonic esters/acids. For example, a polyolefin which has no reactive sites for binding and has poor adhesive properties is typically not a suitable resin, however, a carboxylated polyolefin functions well when matched with a suitable cross-linking agent. A combination of these and other resins, such as non-cross-linkable thermoplastic resins, may also be used as resins. Resins when employed can comprise up to about 80%, preferably between about 10%–80%, and more preferably about 60%–70% by volume of the thermally curable adhesive composition.

In preparing the preferred fluxing composition, the proportions of the four components may be varied over a considerable range and still yield acceptable fluxing activity as well as good post cured material properties. Preferably, the fluxing composition employed does not produce gaseous byproducts that can result in the formation of bubbles in the final cured composition. This can be achieved with thermally curable adhesive compositions preferably formulated as follows:

a) Fluxing agent comprising about 5%–80% (vol) of the composition;
b) Diluent comprising about 5%–80% (vol) of the composition;
c) Free radical initiator comprising about 0%–3% (wt) of the composition; and
d) Resin comprising about 0%–80% (vol) of the composition.

Some of the thermally curable adhesive compositions within these ranges may exhibit undesirably high moisture absorption, low glass transition temperatures, or high coefficients of thermal expansions after cured, but they remain useful as fluxing compositions in applications where these characteristics are not critical.

Most preferably, the thermally curable adhesive composition after being cured has a coefficient of thermal expansion of about 25 ppm/° C., a glass transition temperature in excess of 150° C. and moisture content of less than 2%. These characteristics can be achieved with thermally curable adhesive compositions preferably formulated without any free radical initiator or resin but comprising about 10%–70% (vol) fluxing agent and about 20%–80% (vol) diluent.

While, again, some of the fluxing agents within these ranges may exhibit high coefficient of thermal expansion or low glass transition temperature when cured, they remain useful as fluxes in applications where these characteristics are not critical.

In order for the thermally curable adhesive composition to achieve the largest spreading and wetting by the solder, it must achieve and maintain low viscosity up to the temperature at which the solder melts and wets the metallizations. If the composition becomes too thick before the solder has melted, it will impede the flow of the solder melt and reduce the degree of metal soldering. For this reason, the curing of the composition must occur slowly relative to the time required to reach the melting point of the solder. This can be achieved by selection of the components with appropriate crosslinking temperatures and formulating the appropriate proportions by use of a differential scanning calorimeter to control reaction rates and times.

The thermally curable adhesive composition can also be used as a fluxing adhesive for use in sinterable conductive ink compositions that comprises:

a) 1% to 65% (wt) of a high melting point metal or metal alloy powder, typically comprising Cu powder, however, other metals such as, for example, Ag, Au, Pt, Pd Be, Rh, Ni, Co, Fe, Mo, and high-melting point alloys thereof;
b) 6% to 65% (wt) of a low melting point metal or metal alloy powder (solder), typically comprising Sn, Bi, Pb, Cd, Zn, Ga, In, Hg, Sb, or an alloy thereof or other metal having a melting point that is lower than that of the high melting metal powder in part (a); and
c) 5% to 50% (wt) of the thermally curable adhesive flux composition that also serves a flux composition and as an adhesive.

Preferably the conductive ink composition comprises 13% to 65% (wt) of the high melting point metal, 6% to 29% (wt) of the low melting point metal, and/or 5% to 35% (wt) of the thermally curable adhesive flux composition.

Techniques for employing electrically conductive ink compositions are described in U.S. Pat. Nos. 5,376,403, 5,538,789, and 5,565,267 which are incorporated herein. During the curing process of the sinterable conductive ink compositions, in order for the solder alloy to readily wet the other powder and sinter, the principal requirement of the thermally curable adhesive composition is that the polymers not harden before melting of the solder powder is achieved. Additionally, after curing, the composition must act as an adhesive that strongly binds the cured ink composition to the printed circuit board substrate. The flux compositions of the instant invention are particularly suited for these applications.

The inventive thermally curable composition exhibit the following features:

a) provides sufficient flux activity to promote the solder bump to readily wet the metallization on the substrate during solder reflow, without the presence of corrosive flux activators that can contaminate the silicon chip;
b) promotes solder wetting and self-alignment of the chip to the pads on the substrate by action of the wetting force of the molten solder, during the solder reflow cycle, no curing of the flux composition occurs until the solder bump has been melted;
c) reduces or eliminates gaseous evolution during the reflow cycle that would otherwise create voids;
d) cures quickly and soon after solder bump melts;
e) demonstrates little shrinkage of the composition during curing to minimize the stress resulting from the curing process and subsequent cooling; and
f) forms strong adhesion of the cured composition to the chip, substrate and solder joints.

Synthesis of Fluxing Agents

EXAMPLE 1

Preparation of tris (maleic acid) glycerol monoester, a non-amine fluxing agent with the structure:

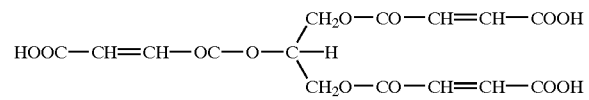

Three moles of maleic anhydride (294 grams) were heated in a flask at 80° C. until fully melted at which time one mole of glycerol (92 grams) was slowly added thereto. The composition was constantly stirred and maintained at 80° C. for three hours. The temperature was then raised to 110° C. for one hour to complete the reaction. Thereafter the product was allowed to cool to room temperature. The reactants were kept in a nitrogen atmosphere throughout. Monitoring the reaction on a Fourier-transform infrared spectrometer, the OH vibrational band at 3,400–3,500 cm$^{-1}$ of the glycerol was observed to become minimized while an ester vibration band at 1,710–1,740 cm$^{-1}$ appeared and maximized, indicating complete reaction of the glycerol and the anhydride. This fluxing agent is characterized by its low viscosity and high flux activity.

EXAMPLE 2

Preparation of tris (maleic acid) triethanolamine monoester: an amine fluxing agent, with the structure:

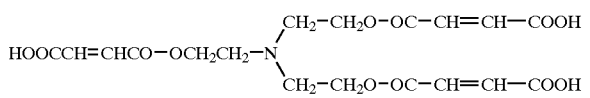

Three moles of maleic anhydride (294 grams) were heated in a flask at 80° C. until fully melted at which time one mole of triethanolamine (149 grams) was slowly added thereto over the course of one hour, so that gelation did not occur. The composition was constantly stirred and maintained at 80° C. To ensure that the reaction went to completion, the product was maintained at 80° C. with constant stirring for an additional hour. The reactants were kept in a nitrogen atmosphere throughout. Then the product was allowed to cool to room temperature. Monitoring the reaction on a Fourier-transform infrared spectrometer, the OH vibrational band at 3,400–3,500 cm$^{-1}$ of the triethanolamine was observed to become minimized while an ester vibration band at 1,710–1,740 cm$^{-1}$ appeared and maximized, indicating complete reaction of the triethanolamine and the anhydride.

This fluxing agent is also characterized by its low viscosity and high flux activity.

EXAMPLE 3

Preparation of Methyl Meso-erythritol Tetramaleic Acid Monoester 39 g maleic anhydride was heated to 80° C. until all the maleic anhydride was melted before 12.2 g of meso-erythritol was added under mechanical stirring. The temperature was then raised to 130° C. for 30 minutes followed by cooling down to 80–90° C. for 2 hours. The reaction is:

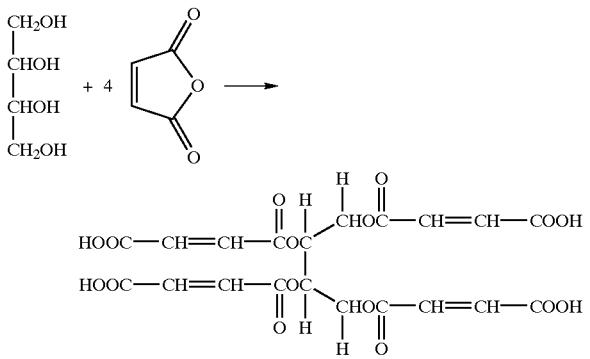

EXAMPLE 4

Preparation of Pentaerythritol Ethoxylate Tetramaleic Acid Monoester 39 g maleic anhydride was heated to 80° C. until all the maleic anhydride was melted before 27 g pentaerythritol ethoxylate (average Mn ca 270) was added under mechanical stirring. The reactants are stirred at 80° C. for 2–3 hours to complete the reaction. The reaction is:

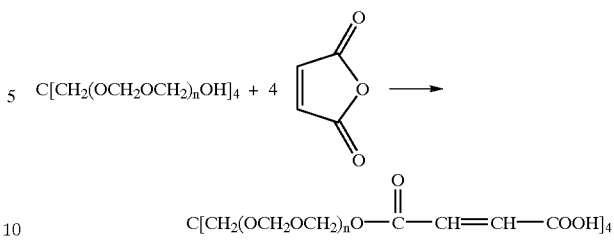

EXAMPLE 5

Preparation of Adonitol Pentamaleic Acid Monoester 49 g maleic anhydride was heated to 80° C. until all the maleic anhydride was melted before 15.2 g of adonitol was added under mechanical stirring. The temperature was then increased to 120° C. for 30 minutes followed by cooling down to 80° C. The reactants were stirred at 80° C. for 3 hours to finish the reaction. The reaction is:

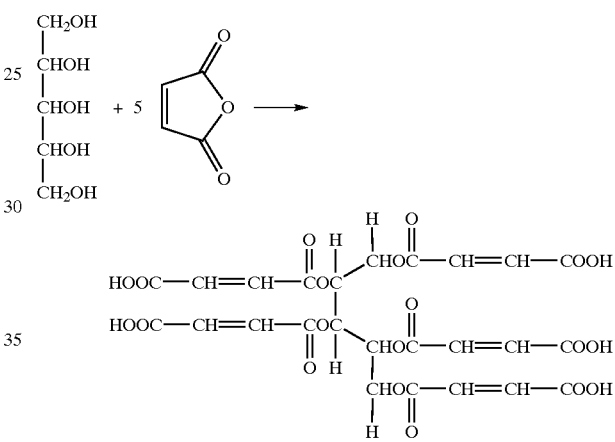

The embodiment of FIG. 15 of a compliant multilayer encapsulating structure comprises a soft solder that is more compliant than conventional tin-lead eutectic solder or the 95% lead-5% tin solder used often for flip chip solder bumps. There are at least two methods for accomplishing this, and other methods will be known to those skilled in the art. One method comprises a tin-lead solder that has been modified with a small concentration, generally less than 1%, of an additive or additives. One such additive, described in U.S. Pat. No. 5,308,578, is a small concentration of cadmium, indium, antimony, or combination thereof which is known to increase the fatigue life of the solder by up to twenty fold. Another method involves incorporating a small concentration of tin-copper or tin-nickel intermetallic which is known to decrease fatigue-induced microstructural coarsening leading to fatigue failure in tin-lead solder.

Another method for increasing the compliance of solder in the present invention involves using a low-melting point solder. It is well known in the art that solders become more compliant as the temperature is elevated to approach their melting temperatures. In the instant invention, the preferred solder has a melting point near the highest operating temperature of the flip chip. Near such a melting point, the solder provides little mechanical resistance to the compliance of the chip-to-substrate interconnection and will readily conform to the stress induced by expansion or contraction of the interconnect during temperature excursions with little fatigue.

Another method for increasing the compliance of solder in the present invention involves using a non-eutectic solder operating between the liquids and solidus temperatures. It is well established that in non-eutectic solders, there exist a temperature region in which the solder is neither fully solid nor fully liquid, but instead is a mixture of both phases, i.e., the plastic range. In the plastic range, the solder does not flow as liquid, yet it has very little mechanical integrity or structural strength. Under stress in the plastic range, the solder will flow readily, conforming to the applied stress without cracks or fatigue, provided the solder is not allowed to leak out of the solder bump by the encapsulating polymer. For this reason, a non-eutectic solder alloy can be selected that will be plastic over most of the temperature range experienced by the chip interconnect. Such solders may contain, but are not limited to, alloys of tin, lead, bismuth, indium, cadmium, gallium, zinc, antimony, and other metals known to the art of soldering.

With the present invention illustrated in FIG. 15, as the flip-chip configuration is heated causing the substrate 20 to laterally expand greater than the chip 10 because of the mismatch in the thermal coefficients of expansion between the chip and substrate, the complaint solder 14 and flexible encapsulant material 22 deform by expanding with the substrate 20 to absorb the strain without causing bending of the chip and substrate (FIG. 16). Likewise, as the flip-chip configuration is cooled below ambient temperature, the complaint solder 14 and flexible encapsulant 22 contract with the substrate 20 to absorb the strain (FIG. 17).

In another embodiment of the invention, there is a chip 10 having solder bumps 14 pre-assembled thereon and being pre-coated with a multi-layer encapsulant material 36 prior to assembly to the substrate 20 (FIG. 18). The multi-layer encapsulant material 36 is uniform across the surface of the chip 10 between the solder bumps 14. Each layer of the multi-layer encapsulant material 36 perform distinct functions. Layers 38 and 40 are attachment and stress distribution layers. Layer 42 is the reworkability layer. Layers 38 and 40 are generally stiffer than layer 42. Layers 38 and 40 are generally polymers or polymers filled with inorganic materials so as to have a high modulus and a low coefficient of thermal expansion such as polyimide. Layer 42 is generally a meltable polymer such as a thermoplastic, for example a polyimide-siloxane co-polymer. The layers can be comprised of coated tape, such as SumiOxy® ITA-5120 or ITA-5315 available from Oxychem, Grand Island, N.Y. A flux adhesive 34 as described previously is applied between the chip/encapsulant/solder bump combination and the substrate. The solder is reflowed and the flux adhesive 34 is hardened. Rework is made possible by the layer 42. The layer 42 and solder bumps 14 are remelted and the chip 10 is pulled away from the substrate 20 (FIG. 20). The flux adhesive 34 firmly retains the layer 40 and part of the solder bumps 14 on the substrate 20 while the chip bonding layer 38 firmly retains the other part of the solder bumps 14 on the chip 10 as the reworkable layer 42 separates without damage to the chip 10 or the substrate 20.

In another embodiment of the present invention, there is provided a multi-layer encapsulant material 44 attached to a chip 10 (FIG. 21). Within the multi-layer encapsulant 44 is an electrical redistribution layer 46 of electrically conductive traces 48 on an insulating layer 50. The insulating layer 50, such as a polymer, encapsulate the solder bumps 52 and 54. Solder bump 52 is connected to the chip 10 in a conventional manner. Solder bumps 54 are attached to the closely spaced contact pads 24 by the electrically conductive traces 48 of the redistribution layer 46. Flux adhesive 34 as described previously retains the chip/multi-layer encapsulant/solder bump combination on the substrate 20 (FIG. 22).

It will now be apparent to those skilled in the art that various modifications, variations, substitutions, and equivalents exist for various elements of the invention but which do not materially depart from the spirit and scope of the invention. Accordingly, it is expressly intended that all such modifications, variations, substitutions and equivalents which fall within the spirit and scope of the invention as defined by the appended claims be embraced thereby.

We claim:

1. A method for making an electrical component assembly that comprises the steps of:
   (a) providing an integrated circuit device having an active surface having one or more solderable contacts with a plurality of discrete solder bumps such that said one or more solderable contacts has a solder bump associated therewith and electrically interconnected thereto, and applying to at least a portion of the active surface and solder bumps a first portion encapsulant;
   (b) providing a printed circuit substrate having a surface with a plurality of discrete metallized pads thereon, at least one pad corresponding to at least one solder bump on said integrated circuit device;
   (c) disposing a second portion encapsulant comprising a fluxing agent between the integrated circuit device and the printed circuit substrate; and
   (d) attaching the integrated circuit device to the printed circuit substrate to form a combined unit wherein the solder bumps face towards and are aligned with their corresponding pads, and there exists a thin layer of said second portion encapsulant at least between the solder bumps and the printed circuit substrate;
   wherein said first portion encapsulant comprises a chemical composition selected so as to not adversely affect properties of the second portion, said properties including
      i. a fluxing agent promoting wetting of the metallized pads by the solder;
      ii. chemically immobilizing the fluxing agent and flux reaction byproducts after cure;
      iii. having a low viscosity during a soldering operation that does not impede flow of molten solder;
      iv. resisting corrosion and resisting degradation at soldering temperatures; and
      v. not evolving any gases that can cause voids or bubbles.

2. The method of claim 1 wherein the second portion encapsulant is applied to the printed circuit substrate.

3. The method of claim 1 wherein the second portion encapsulant is applied to the integrated circuit device.

4. The method of claim 1 wherein the first portion encapsulant comprises a polymer having a filler.

5. A method for making an electrical component assembly that comprises the steps of:
   (a) providing an integrated circuit device having an active surface having one or more solderable contacts with a plurality of discrete solder bumps such that said one or more solderable contacts has a solder bump associated therewith and electrically interconnected thereto, and applying to at least a portion of the active surface and solder bumps an encapsulant comprising a polymer portion and a flux portion which is distinct and separate from the polymer portion;
   (b) providing a printed circuit substrate having a surface with a plurality of discrete metallized pads thereon, at least one pad corresponding to at least one solder bump on said integrated circuit device;

(c) attaching the integrated circuit device to the printed circuit substrate to form a combined unit wherein the solder bumps face towards and are aligned with their corresponding pads;

wherein said polymer portion comprises a chemical composition selected so as to not adversely affect the properties of the flux portion, said properties including
i. promoting wetting of the metal pads by the solder;
ii. having a low viscosity during the soldering operation that does not impede the flow of the molten solder;
iii. resisting corrosion and resisting degradation at soldering temperatures; and
not evolving any gases that can cause voids or bubbles.

6. The method of claim 5 further comprising heating the connected parts to melt the solder of the solder bumps and simultaneously melt at least a portion of the solid of the encapsulant to a low enough viscosity so as to not impede a flow of the molten solder over the printed-circuit pads.

7. The method of claim 5 wherein the encapsulant is applied so that the bumps protrude beyond the encapsulant.

8. The method of claim 5 wherein the encapsulant is applied so that the bumps are covered by the encapsulant.

9. The method of claim 8 including the further step of removing at least a portion of the encapsulant to expose the solder bumps.

10. The method of claim 6 wherein the encapsulant comprises a portion that can be remelted sufficiently to allow removal of the device after it has been assembled to the substrate.

11. The method of claim 1 further comprising heating the combined unit up to a temperature that melts the solder bumps and simultaneously melts at least the second portion encapsulant to a low viscosity, maintaining at least the second portion encapsulant at the low viscosity while the solder bumps wet the metallized pads.

12. The method of claim 11 further comprising allowing the melted solder and encapsulant materials to harden.

13. The method of claim 12 wherein the second encapsulant includes at least one portion that can be remelted sufficiently to allow removal of the integrated circuit device after it has been assembled to the printed circuit substrate.

14. The method of claim 13 wherein said portion that can be remelted comprises a thermoplastic.

15. The method of claim 12 wherein after curing said cured first encapsulant portion has a coefficient of thermal expansion of about 25 parts per million per degree Celsius.

16. The method of claim 1 wherein the first portion encapsulant has a modulus greater than a modulus of the second portion encapsulant.

17. The method of claim 1 wherein the first portion encapsulant is highly filled.

18. The method of claim 1 wherein the second portion encapsulant is lightly filled or devoid of filler.

19. The method of claim 1 wherein the second portion encapsulant is applied to said first portion encapsulant on the integrated circuit device.

20. The method of claim 5 further comprising heating the combined unit up to a temperature that melts the solder bumps and simultaneously melts at least a portion of the encapsulant to a low viscosity and maintaining it at a low viscosity while the solder bumps wet the metallized pads.

21. The method of claim 20 further comprising allowing the melted solder and encapsulant materials to harden and the flux to be immobilized within the encapsulant.

22. The method of claim 1 wherein at least a portion of said solder bumps is exposed from said first portion encapsulant.

23. The method of claim 1 wherein the first portion encapsulant comprises a solid or a thick liquid, partially or fully cured.

24. The method of claim 1 wherein the first portion encapsulant comprises an epoxy resin.

25. The method of claim 1 wherein the first portion encapsulant comprises a carboxylic acid.

26. The method of claim 1 wherein the second portion encapsulant comprises a chemical or mechanical mechanism for impeding or preventing the onset of polymerization of the composition until the solder has melted and wetted the surfaces to be soldered.

27. The method of claim 1 wherein said fluxing agent is selected so as to crosslink into a polymer when heated in a soldering step.

28. The method of claim 1 wherein one of said first and second portion encapsulants comprises a compliant encapsulant that can absorb stresses caused by thermal expansion and contraction.

29. The method of claim 1 wherein said second portion encapsulant comprises a liquid or solid composition primary fluxing agent and a crosslinking monomer or polymer.

30. The method of claim 1 further comprising applying heat so that the solder is reflowed while simultaneously the encapsulant hardens.

31. The method of claim 30 wherein the second portion encapsulant intermixes with the first portion encapsulant during heating such that the second portion encapsulant has minimal effect on the reliability of the flip-chip structure, despite the second portion encapsulant having generally a lower modulus and higher coefficient of thermal expansion than the first portion encapsulant.

32. The method of claim 30 wherein a cure time of said first encapsulant is relatively slow in relation to a melting time of said solder bumps.

33. The method of claim 30 wherein after curing said cured first portion encapsulant has a modulus greater than about 0.1 Gpa.

34. The method of claim 30 wherein the thickness of said second portion encapsulant is a relatively thin portion of the overall encapsulant.

35. The method of claim 11 wherein the second portion encapsulant intermixes with the first portion encapsulant during heating such that the second portion encapsulant has minimal effect on the reliability of the flip-chip structure, despite the second portion encapsulant having generally a lower modulus and higher coefficient of thermal expansion than the first portion encapsulant.

36. The method of claim 12 wherein a cure time of said first encapsulant is relatively slow in relation to a melting time of said solder bumps.

37. The method of claim 12 wherein after curing said cured first portion encapsulant has a modulus greater than about 0.1 Gpa.

38. The method of claim 12 wherein the thickness of said second portion encapsulant is a relatively thin portion of the overall encapsulant.

39. The method of claim 5 wherein the flux portion is lightly filled or devoid of filler.

40. The method of claim 5 wherein said flux portion is selected so as to crosslink into a polymer when heated in a soldering step.

41. The method of claim 5 wherein the encapsulant comprises a compliant encapsulant that can absorb stresses caused by thermal expansion and contraction.

42. The method of claim 5 wherein said flux portion comprises a liquid or solid composition primary fluxing agent and a crosslinking monomer or polymer.

43. The method of claim 5 wherein the polymer portion comprises a solid or a thick liquid, partially or fully cured.

44. The method of claim 5 wherein the polymer portion comprises an epoxy resin.

45. The method of claim 5 wherein the polymer portion comprises a carboxylic acid.

46. The method of claim 5 wherein the flux portion comprises a carboxylic acid.

47. The method of claim 5 wherein the flux portion encapsulant comprises a chemical or mechanical mechanism for impeding or preventing the onset of polymerization of the composition until the solder has melted and wetted the surfaces to be soldered.

48. The method of claim 5 further comprising applying heat so that the solder is reflowed while simultaneously the encapsulant hardens.

49. The method of claim 48 wherein after curing said cured polymer portion encapsulant has a coefficient of thermal expansion of about 25 parts per million per degree Celsius.

50. The method of claim 48 wherein the polymer portion intermixes with the flux portion during heating such that the flux portion has minimal effect on the reliability of the flip-chip structure, despite the flux portion having generally a lower modulus and higher coefficient of thermal expansion than the polymer portion.

51. The method of claim 48 wherein a gap between said integrated circuit device and said printed circuit substrate around said plurality of solder bumps is about 2 to 6 mils; and further comprising the step of completely filling said gap with said encapsulant.

52. The method of claim 48 wherein after curing said cured encapsulant has a modulus greater than about 0.1 Gpa.

53. The method of claim 48 wherein the thickness of said flux portion is a relatively thin portion of the overall encapsulant.

54. The method of claim 6 wherein after curing said cured polymer portion encapsulant has a coefficient of thermal expansion of about 25 parts per million per degree Celsius.

55. The method of claim 6 wherein the polymer portion intermixes with the flux portion during heating such that the flux portion has minimal effect on the reliability of the flip-chip structure, despite the flux portion having generally a lower modulus and higher coefficient of thermal expansion than the polymer portion.

56. The method of claim 6 wherein a gap between said integrated circuit device and said printed circuit substrate around said plurality of solder bumps is about 2 to 6 mils; and further comprising the step of completely filling said gap with said encapsulant.

57. The method of claim 6 wherein after curing said cured encapsulant has a modulus greater than about 0.1 Gpa.

58. The method of claim 6 wherein the thickness of said flux portion is a relatively thin portion of the overall encapsulant.

* * * * *